US012765400B2

(12) United States Patent
Xue et al.

(10) Patent No.: US 12,765,400 B2
(45) Date of Patent: Oct. 13, 2026

(54) SEMICONDUCTOR PACKAGE HAVING PARTIALLY PLATED LEAD FLANK AND METHOD OF MAKING THE SAME

(71) Applicant: ALPHA AND OMEGA SEMICONDUCTOR INTERNATIONAL LP, Toronto (CA)

(72) Inventors: Yan Xun Xue, Los Gatos, CA (US); Madhur Bobde, Sunnyvale, CA (US); Long-Ching Wang, Cupertino, CA (US); Wenjun Li, Portland, OR (US); Xiaoguang Zeng, Shanghai (CN)

(73) Assignee: ALPHA AND OMEGA SEMICONDUCTOR INTERNATIONAL LP, Toronto (CA)

( * ) Notice: Subject to any disclaimer, the term of this patent is extended or adjusted under 35 U.S.C. 154(b) by 378 days.

(21) Appl. No.: 18/443,842

(22) Filed: Feb. 16, 2024

(65) Prior Publication Data

US 2025/0266333 A1 Aug. 21, 2025

(51) Int. Cl.

| | |
|---|---|
| ***H10W 70/40*** | (2026.01) |
| ***H10P 14/47*** | (2026.01) |
| ***H10W 70/04*** | (2026.01) |
| ***H10W 72/00*** | (2026.01) |
| ***H10W 74/01*** | (2026.01) |
| ***H10W 74/10*** | (2026.01) |

(52) U.S. Cl.

CPC ........... *H10W 70/481* (2026.01); *H10P 14/47* (2026.01); *H10W 70/048* (2026.01); *H10W 70/457* (2026.01); *H10W 74/111* (2026.01); *H10W 72/0198* (2026.01); *H10W 74/014* (2026.01)

(58) Field of Classification Search

None

See application file for complete search history.

(56) References Cited

U.S. PATENT DOCUMENTS

| | | | | |
|---|---|---|---|---|
| 10,796,986 | B2 | 10/2020 | Macheiner et al. | |
| 11,373,940 | B2 | 6/2022 | Lee et al. | |
| 11,581,195 | B2 | 2/2023 | Xue et al. | |
| 12,261,101 | B2 | 3/2025 | Xue et al. | |
| 2017/0271246 | A1 | 9/2017 | Macheiner et al. | |
| 2020/0303295 | A1* | 9/2020 | Ichikawa ............ | H10W 70/421 |
| 2022/0199425 | A1* | 6/2022 | Xue .................... | H10W 70/048 |

FOREIGN PATENT DOCUMENTS

| | | | |
|---|---|---|---|
| CN | 105810648 | A | 7/2016 |
| TW | 202329264 | A | 7/2023 |

* cited by examiner

*Primary Examiner* — Nishath Yasmeen

(74) *Attorney, Agent, or Firm* — Chen-Chi Lin

(57) ABSTRACT

A semiconductor package comprises a lead frame, a chip, and a molding encapsulation. The lead frame comprises one or more die paddles and a plurality of leads. Each of the plurality of leads comprises a base member and a protrusion member. A width of an end surface of the protrusion member of each of the plurality of leads is less than 50% of a width of a corresponding base member so as to improve solderability. A method, for fabricating semiconductor packages, comprises the steps of providing a lead frame array, mounting a chip, forming a molding encapsulation, applying a cutting process or a punching process, applying a plating process, and applying a singulation process.

16 Claims, 10 Drawing Sheets

SEMICONDUCTOR PACKAGE HAVING PARTIALLY PLATED LEAD FLANK AND METHOD OF MAKING THE SAME

FIELD OF THE INVENTION

This invention relates generally to a semiconductor package having a plurality of leads with partially plated flanks and a method of making the same. More particularly, the present invention relates to a semiconductor package fabricated using a lead frame comprising dam bars and slots.

BACKGROUND OF THE INVENTION

Conventional Quad-flat no leads (QFN) and Dual-flat no leads (DFN) micro lead packages comprise exposed copper at end surfaces of leads after a singulation process or a punching process. The exposed copper subjects to oxidation over time. The oxidized copper end surfaces degrades a solder connection quality.

The present disclosure provides a solution by introducing a dam bar and a plurality of slots in a lead frame so as to form a plurality of leads with more than 50% wettable area in an end region and two opposite side surfaces of each of the plurality of leads.

SUMMARY OF THE INVENTION

The present invention discloses a semiconductor package comprising a lead frame, a chip, and a molding encapsulation. The lead frame comprises one or more die paddles and a plurality of leads. Each of the plurality of leads comprises a base member and a protrusion member. A width of an end surface of the protrusion member of each of the plurality of leads is less than 50% of a width of a corresponding base member so as to improve solderability.

A method for fabricating semiconductor packages is disclosed. The method comprises the steps of providing a lead frame array, mounting a chip, forming a molding encapsulation, applying a cutting process or a punching process, applying a plating process, and applying a singulation process.

DETAILED DESCRIPTION OF THE INVENTION

Figure 1:
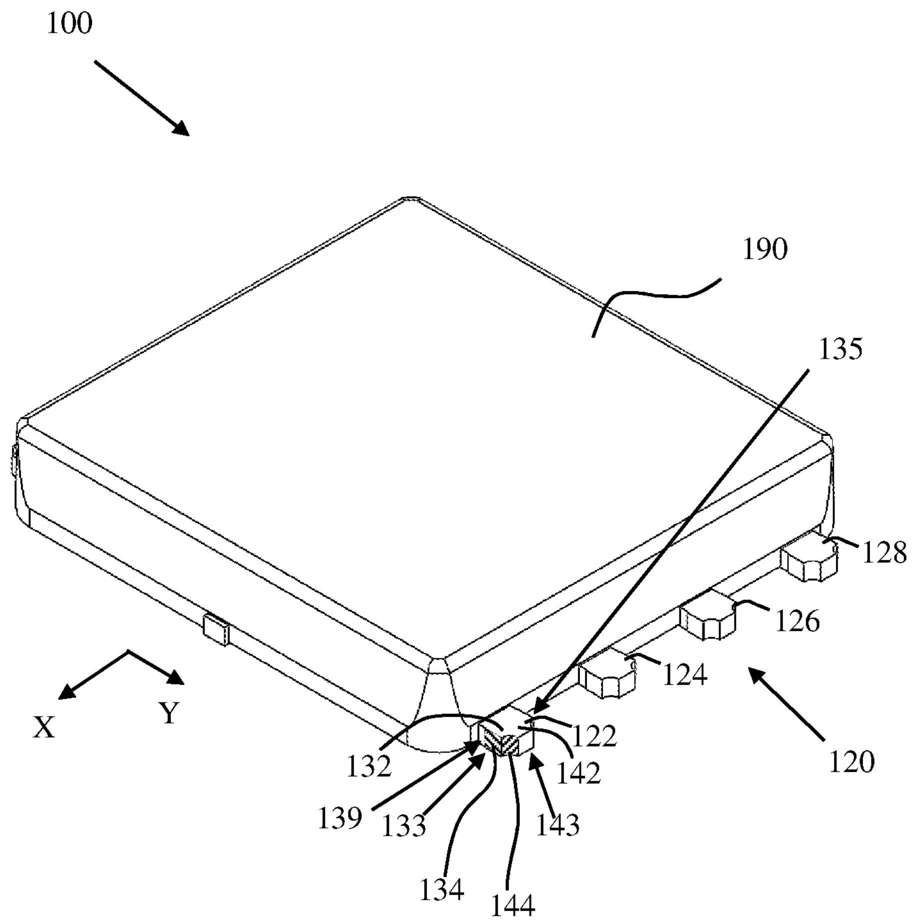
FIG. 1 shows a perspective view of a semiconductor package in examples of the present disclosure.

FIG. 1 shows a perspective view of a semiconductor package 100 in examples of the present disclosure. In one example, the semiconductor package 100 is a punched dual flat no-Lead (DFN) package. The semiconductor package 100 comprises a lead frame 510 of FIG. 5A, a chip 550 of FIG. 5B, and a molding encapsulation 190. The lead frame 510 comprises one or more die paddles 512 of FIG. 5A and a first plurality of leads 120. The first plurality of leads 120 extend away from the one or more die paddles 512 of FIG. 5A along a first direction Y. Although four leads 122, 124, 126, and 128 are shown in FIG. 1, the number of leads included in the first plurality of leads 120 may vary. Each of the first plurality of leads 120 comprises a base member (or base portion) extending outside the molding encapsulation and a protrusion member (or tip portion) extending to the end of each lead. For example, the lead 122 comprises a base member 132 and a protrusion member 142. In one example, a thickness of the base member 132 equals a thickness of the protrusion member 142. The protrusion member 142 directly connects to the base member 132. The base member 132 comprises a first side surface 133 and a second side surface 135. The protrusion member 142 comprises an end surface 143. A portion 139 (non-hatched area representing exposed copper after the cutting process) of the first side surface 133 of the base member 132 adjacent the molding encapsulation is not plated. The end surface 143 of the protrusion member 142 is located at the central portion of the end of lead 122 and is not plated. The hatched-line area 134 of the base member 132 and the hatched-line area 144 of the protrusion member 142 are plated with a wettable metal for soldering. The hatched-line area 134 of the base member 132 is directly connected to the hatched-line area 144 of the protrusion member 142. In one example, the wettable metal for soldering covers the hatched-line area 134 of the base member 132 and the hatched-line area 144 of the protrusion member 142. In one example, the wettable metal for soldering is tin or Sn.

Figure 5A:
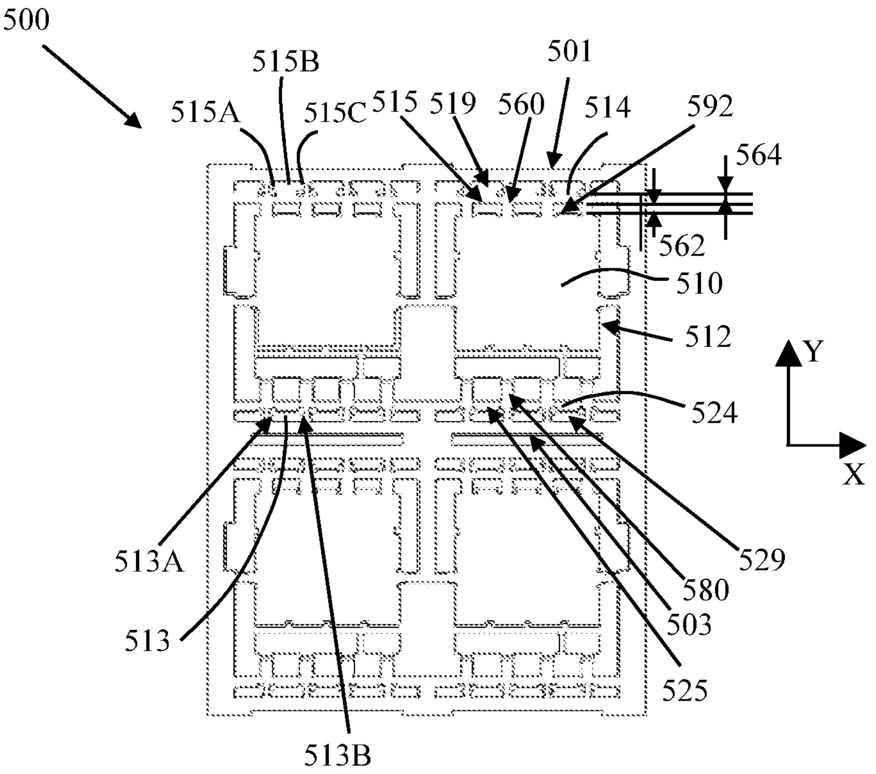
FIGS. 5A, 5B, 5C, 5D, 5E, 5F, and 5G show the steps of the process to fabricate a semiconductor package in examples of the present disclosure.
Figure 5B:
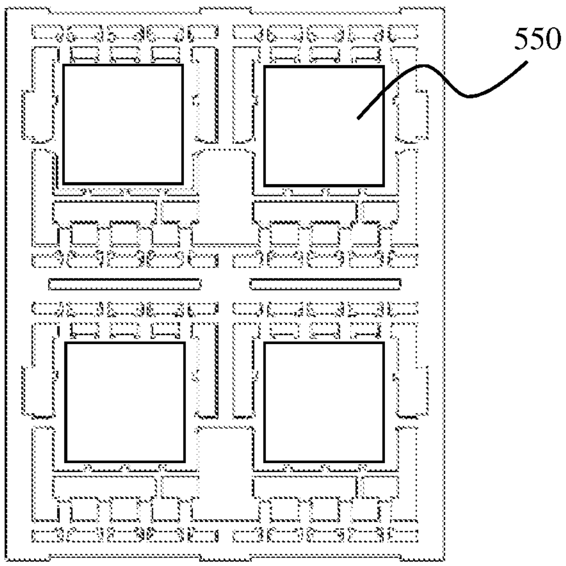

The chip 550 of FIG. 5B is attached to the one or more die paddles 512 of FIG. 5A of the lead frame 510 of FIG. 5A. The molding encapsulation 190 encloses the chip 550 of FIG. 5B.

Figure 2A:
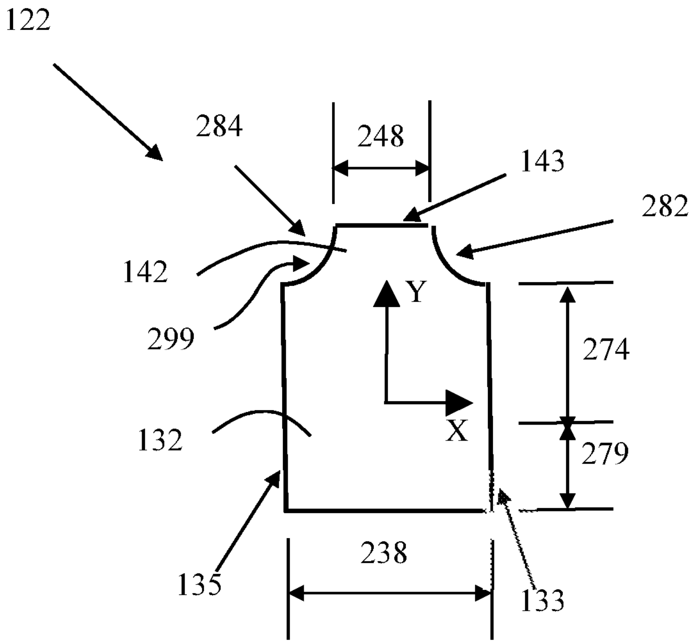
FIG. 2A shows a top view of a lead in examples of the present disclosure.

FIG. 2A shows a top view of the lead 122 of FIG. 1 in examples of the present disclosure. A width 248 of the end surface 143 of the protrusion member 142 of the lead 122 is less than 50% of a width 238 of the base member 132 of the lead 122 so as to reduce the non-plated surface at an end region of the lead 122 (to improve solderability). In one example, the width 248 is 0.2 mm and the width 238 is in a range from 0.41 mm to 0.5 mm. More than 50% of the first side surface 133 of the base member 132 of the lead 122 is plated with a wettable metal for soldering [a length 274 of the hatched-line area 134 of FIG. 1 is longer than a length 279 of the portion 139 (non-hatched area) of FIG. 1] so as to increase the portion of plated side surface of the lead 122 (to improve solderability). Similarly, more than 50% of the second side surface 135 of the base member 132 of the lead 122 is plated with a wettable metal for soldering.

In examples of the present disclosure, the lead 122 further comprises a first notch 282 and a second notch 284 that form the protrusion member 142 with a shape of reducing width away from the base member 132. The first notch 282 is positioned between the first side surface 133 of the base member 132 of the lead 122 and the end surface 143 of the protrusion member 142 of the lead 122 thus forming a first side surface (the hatched-line area 144 of FIG. 1) of the protrusion member 142. The second notch 284 is positioned between the second side surface 135 of the base member 132 of the lead 122 and the end surface 143 of the protrusion member 142 of the lead 122 thus forming a second side surface 299 of the protrusion member 142. The end surface 143 separates the first side surface (the hatched-line area 144 of FIG. 1) and the second side surface 299 of the protrusion member 142. The first side surface (the hatched-line area 144 of FIG. 1) of the protrusion member 142 of the lead 122 and the second side surface 299 of the protrusion member 142 are curve and plated with the wettable metal for soldering.

Figure 2B:
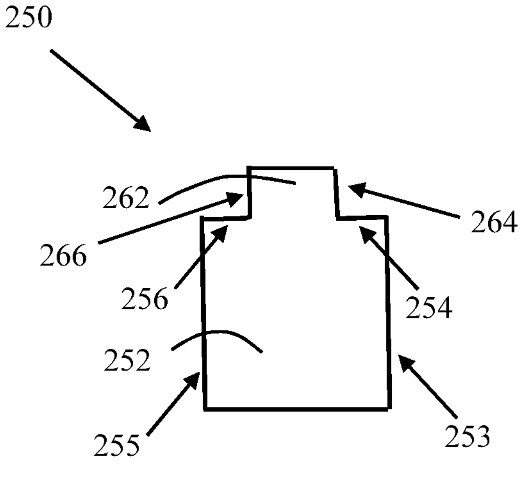
FIG. 2B shows a top view of another lead in examples of the present disclosure.

FIG. 2B shows a top view of a lead 250 in examples of the present disclosure. The lead 250 comprises a base member 252 and a protrusion member 262. In one example, a thickness of the base member 252 equals a thickness of the protrusion member 262. The protrusion member 262 directly connects to the base member 252. The protrusion member 262 of the lead 250 comprises a first flat side surface 264 and a second flat side surface 266 opposite the first flat side surface 264. The base member 252 of the lead 250 comprises a first flat surface 254 and a second flat surface 256. The first flat surface 254 of the base member 252 is perpendicular to and directly connected to the first side surface 253 of the base member 252. The second flat surface 256 of the base member 252 is perpendicular to and directly connected to the second side surface 255 of the base member 252. The first flat side surface 264 of the protrusion member 262, the second flat side surface 266 of the protrusion member 262, the first flat surface 254 of the base member 252, and the second flat surface 256 of the base member 252 are plated with the wettable metal for soldering.

Figure 3:
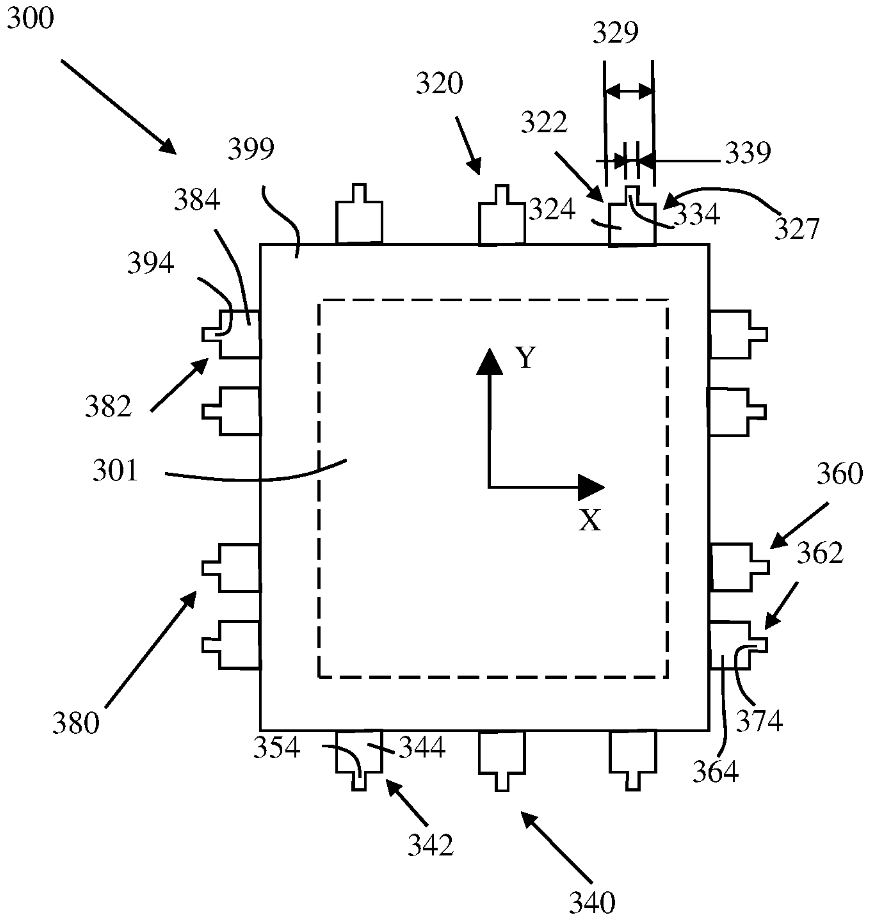
FIG. 3 is a top view of another semiconductor package in examples of the present disclosure.

FIG. 3 is a top view of a semiconductor package 300 in examples of the present disclosure. In one example, the semiconductor package 300 is a punched quad flat no-Lead (QFN) package. The semiconductor package 300 comprises a lead frame 610 of FIG. 6, a chip 301, and a molding encapsulation 399. The lead frame 610 comprises one or more die paddles 512 of FIG. 5A and a first plurality of leads 320, a second plurality of leads 340, a third plurality of leads 360, and a fourth plurality of leads 380. The first plurality of leads 320 extend away from the one or more die paddles 512 of FIG. 5A along a first direction (positive Y direction). The second plurality of leads 340 extend away from the one or more die paddles 512 of FIG. 5A along a second direction (negative Y direction) opposite the first direction (positive Y direction). The third plurality of leads 360 extend away from the one or more die paddles 512 of FIG. 5A along a third direction (positive X direction) perpendicular to the first direction (positive Y direction). A fourth plurality of leads 380 extend away from the one or more die paddles 512 of FIG. 5A along a fourth direction (negative X direction) opposite the third direction (positive X direction).

Each of the first plurality of leads 320 comprises a base member and a protrusion member. For example, the lead 322 comprises a base member 324 and a protrusion member 334. Each of the second plurality of leads 340 comprises a base member and a protrusion member. For example, the lead 342 comprises a base member 344 and a protrusion member 354. Each of the third plurality of leads 360 comprises a base member and a protrusion member. For example, the lead 362 comprises a base member 364 and a protrusion member 374. Each of the fourth plurality of leads 380 comprises a base member and a protrusion member. For example, the lead 382 comprises a base member 384 and a protrusion member 394.

The base member 324 comprises a first side surface 327 and a second side surface. The protrusion member 334 comprises an end surface. A width 339 of the end surface of the protrusion member 334 is less than 50% of the width 329 of the base member 324. Similar construction for the lead 342, the lead 362, and the lead 382. A width of the end surface of the protrusion member 354 is less than 50% of the width of the base member 344. A width of the end surface of the protrusion member 374 is less than 50% of the width of the base member 364. A width of the end surface of the protrusion member 394 is less than 50% of the width of the base member 384.

More than 50% of the first side surface 327 of the base member 324 and more than 50% of the second side surface of the base member 324 are plated with a wettable metal for soldering. Similar construction for the lead 342, the lead 362, and the lead 382. More than 50% of the first side surface of the base member 344 and more than 50% of the second side surface of the base member 344 are plated with a wettable metal for soldering. More than 50% of the first side surface of the base member 364 and more than 50% of the second side surface of the base member 364 are plated with a wettable metal for soldering. More than 50% of the first side surface of the base member 384 and more than 50% of the second side surface of the base member 384 are plated with a wettable metal for soldering.

The end surface of the protrusion member 334, the end surface of the protrusion member 354, end surface of the protrusion member 374, and end surface of the protrusion member 394 are not plated with the metal.

Figure 4:
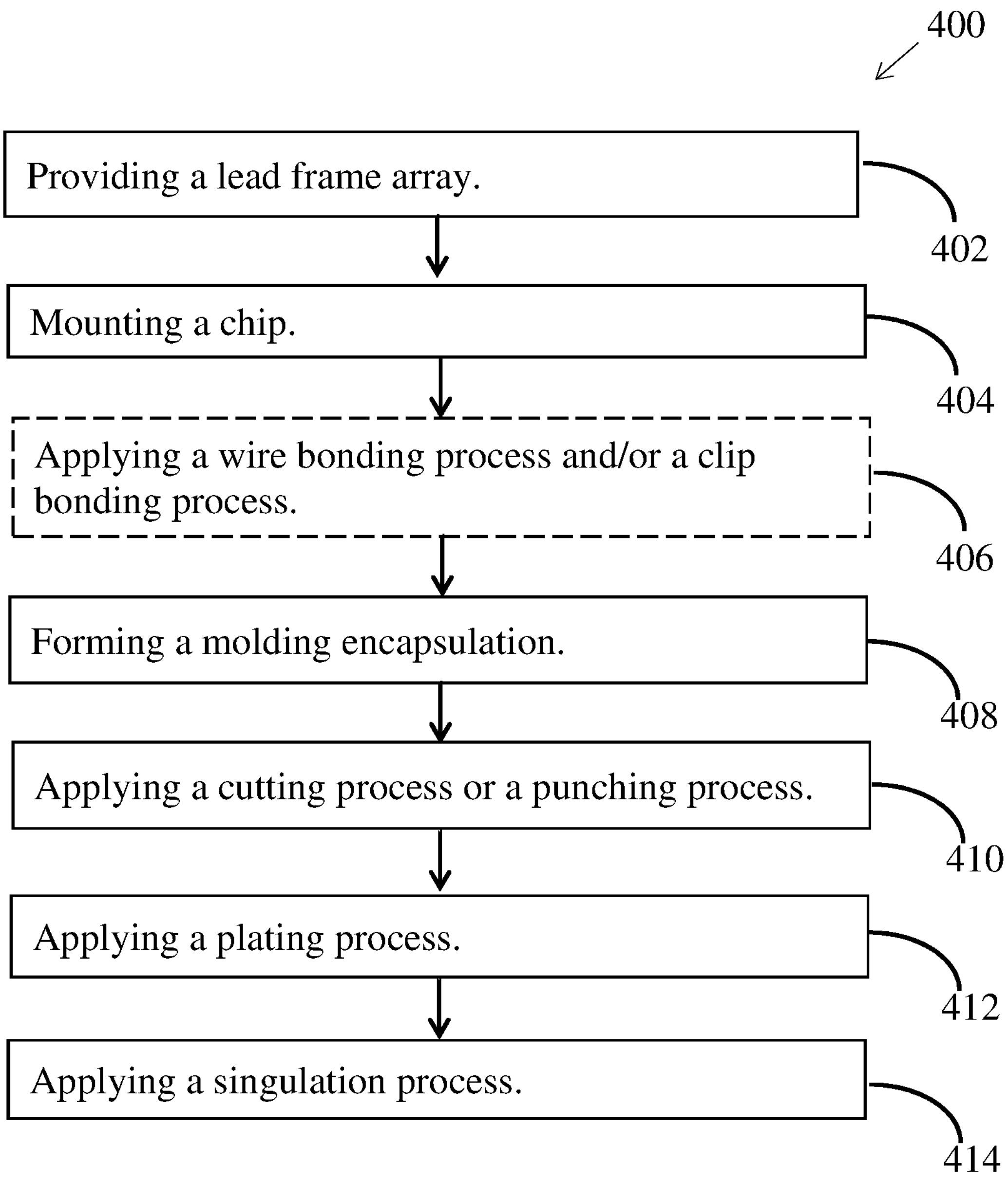
FIG. 4 is a flowchart of a process to develop a semiconductor package in examples of the present disclosure.

FIG. 4 is a flowchart of a process 400 to develop a semiconductor package in examples of the present disclosure. The process 400 may start from block 402. FIGS. 5A-5G show the top view of the corresponding steps.

In block 402, referring now to FIG. 5A, a lead frame array 500 is provided. The lead frame array 500 comprises one or more lead frames including lead frame 510. Although only four lead frames are shown in FIG. 5A, the number of lead frames included in the lead frame array 500 may vary. The lead frame 510 comprises one or more die paddles 512, a first dam bar 514, a second dam bar 524, a first plurality of slots 519, a second plurality of slots 529, a first plurality of leads 560, and a second plurality of leads 580. The first dam bar 514 comprises a first plurality of dam bar connecting sections 515. The second dam bar 524 comprises a second plurality of dam bar connecting sections 525. The first plurality of slots 519 are between the first dam bar 514 and a first side 501 of the lead frame 510. The second plurality of slots 529 are between the second dam bar 524 and a second side 503 of the lead frame 510.

The first plurality of leads 560 extend away from the one or more die paddles 512 along a first direction (positive Y-direction). Each of the first plurality of leads 560 is connected to the first dam bar 514. A second plurality of leads 580 extend away from the one or more die paddles 512 along a second direction (negative Y-direction). Each of the second plurality of leads 580 is connected to the second dam bar 524.

In examples of the present disclosure, each of the first plurality of dam bar connecting sections 515 comprises a first end section 515A, a center section 515B, and a second end section 515C. The center section 515B is between the first end section 515A and the second end section 515C. A cross-sectional area of the first end section 515A is smaller than a cross-sectional area of the center section 515B. A cross-sectional area of the second end section 515C is smaller than the cross-sectional area of the center section 515B.

In examples of the present disclosure, each of the first plurality of dam bar connecting sections comprises a first arc portion and a second arc portion. For example, damp bar connecting section 513 comprises a first arc portion 513A and a second arc portion 513B.

In examples of the present disclosure, each lead frame of the one or more lead frames further comprises a first plurality of rectangular holes between the first plurality of dam bar connecting sections and the one or more die paddles. For example, the plurality of rectangular holes 592 are between the first plurality of dam bar connecting sections 515 and the one or more die paddles 512. A lateral dimension of each of the first plurality of rectangular holes is smaller than a lateral dimension of a corresponding dam bar connecting section of the first plurality of dam bar connecting sections. For example, dimension 562 is smaller than dimension 564. In one example, dimension 562 is 0.1 mm and dimension 564 is in a range from 0.2 to 0.3 mm.

In examples of the present disclosure, the lead frame array 500 is not a pre-plated frame (PPF) array. Block 402 may be followed by block 404.

In block 404, referring now to FIG. 5B, a chip 550 is mounted on the one or more die paddles 512. In one example, the chip 550 is a power semiconductor transistor, such as a metal-oxide-semiconductor field-effect transistor (MOSFET). Block 404 may be followed by block 406 or block 408.

Figure 5C:
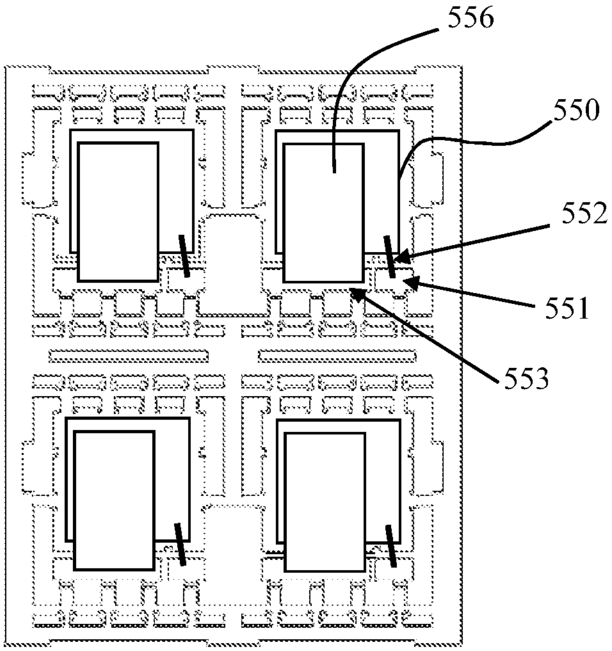

In optional block 406 (shown in dashed lines), referring now to FIG. 5C, a wire bonding process and/or a clip bonding process is applied. One or more wires 552 connect the chip 550 to the gate lead 551 and a clip 556 connect the chip 550 to the source lead 553. Block 406 may be followed by block 408.

Figure 5D:
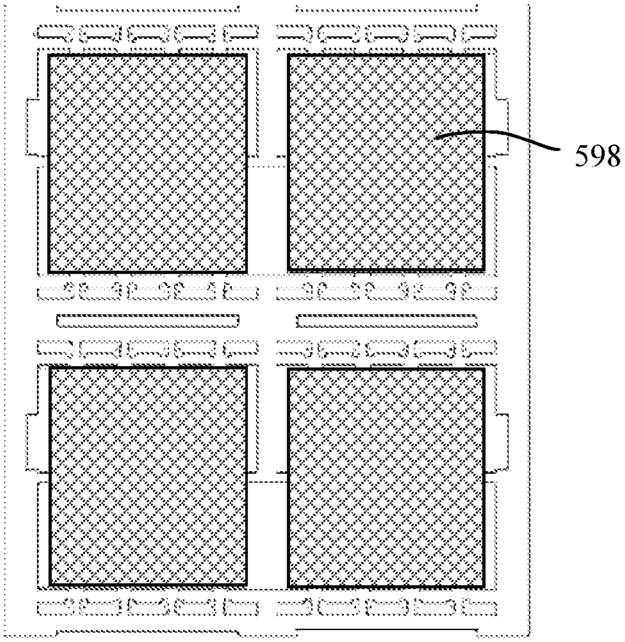

In block 408, referring now to FIG. 5D, a molding encapsulation 598 is formed. The molding encapsulation 598 encloses the chip 550. Block 408 may be followed by block 410.

Figure 5E:
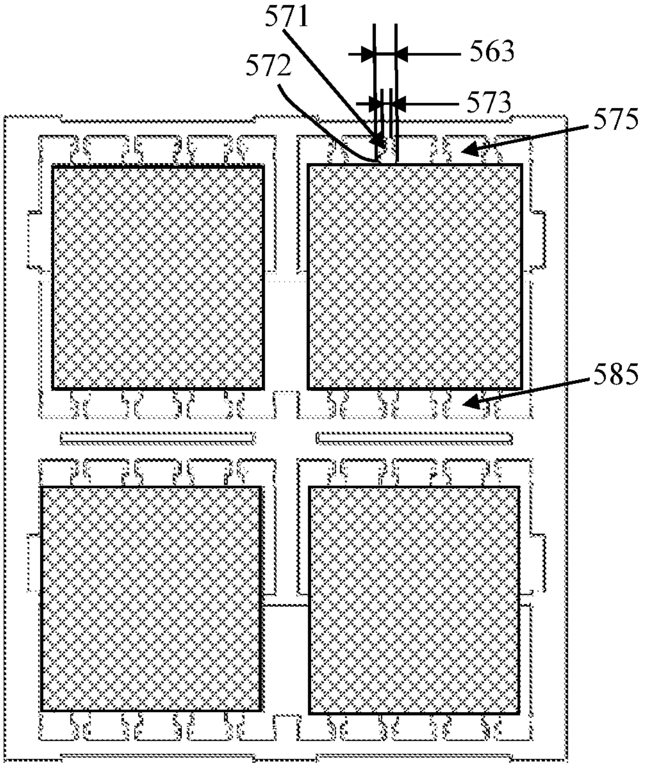

In block 410, referring now to FIG. 5E, a cutting process or a punching process is applied. The first plurality of dam bar connecting sections 515 of FIG. 5A are removed so as to form a first plurality of slots 575. The second plurality of dam bar connecting sections 525 of FIG. 5A are removed so as to form a second plurality of slots 585. A width 573 of the end surface of the protrusion member of the lead 571 is less than 50% of a width 563 of the base member 572 of the lead 571 so as to reduce the non-plated surface at an end region of the lead 571 (to improve solderability). Block 410 may be followed by block 412.

Figure 5F:
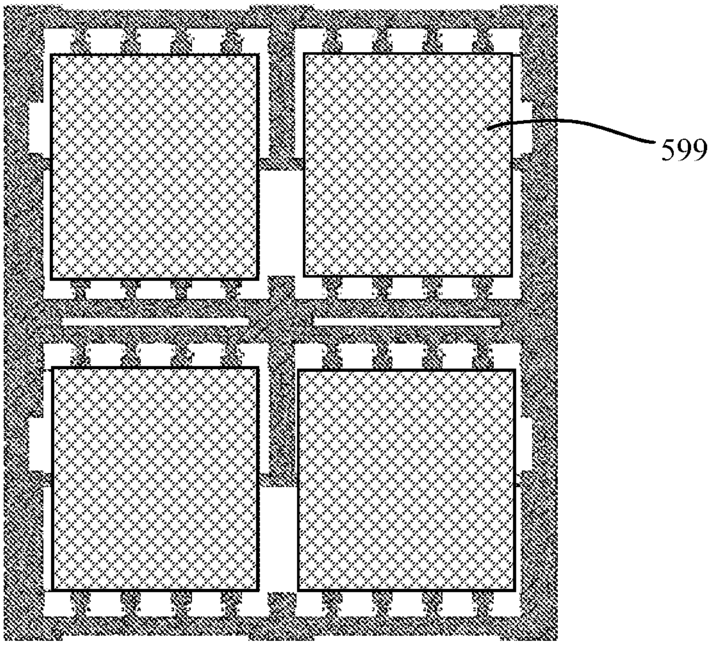

In block 412, referring now to FIG. 5F, a plating process is applied. Portions of the lead frame 510, not covered by the molding encapsulation 598, are plated with a wettable metal for soldering 599. In one example, block 412 is the only plating process in the process 400 (no other plating process is conducted). In one example, the wettable metal for soldering 599 is tin or Sn. Block 412 may be followed by block 414.

Figure 5G:
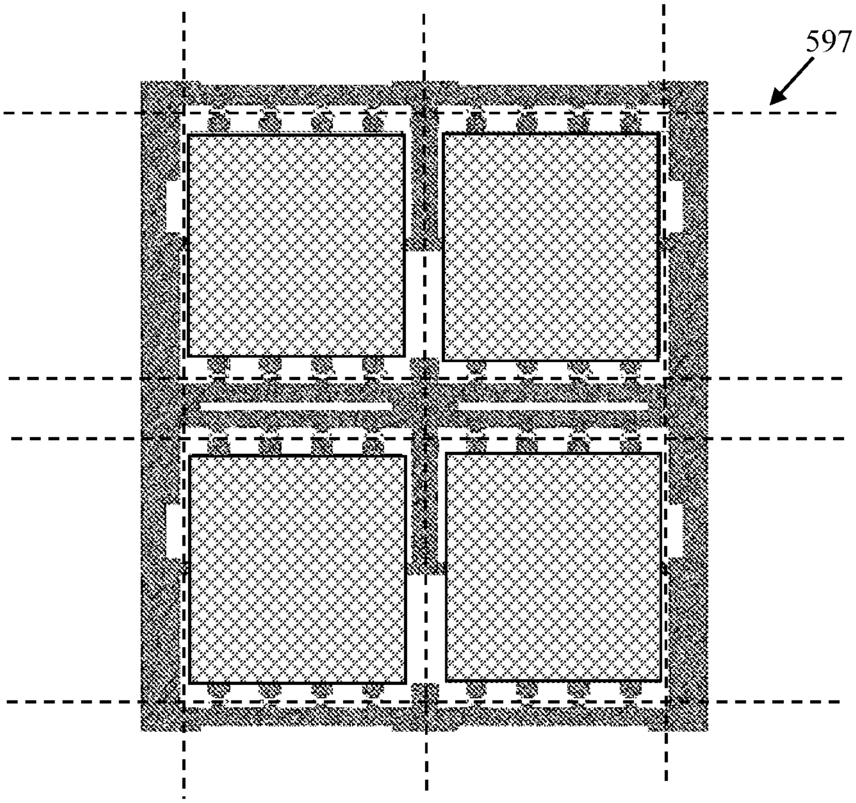

In block 414, referring now to FIG. 5G, a singulation process (along a plurality of cutting lines 597) is applied so as to form a plurality of semiconductor packages (for example, the semiconductor package 100 of FIG. 1).

Figure 6:
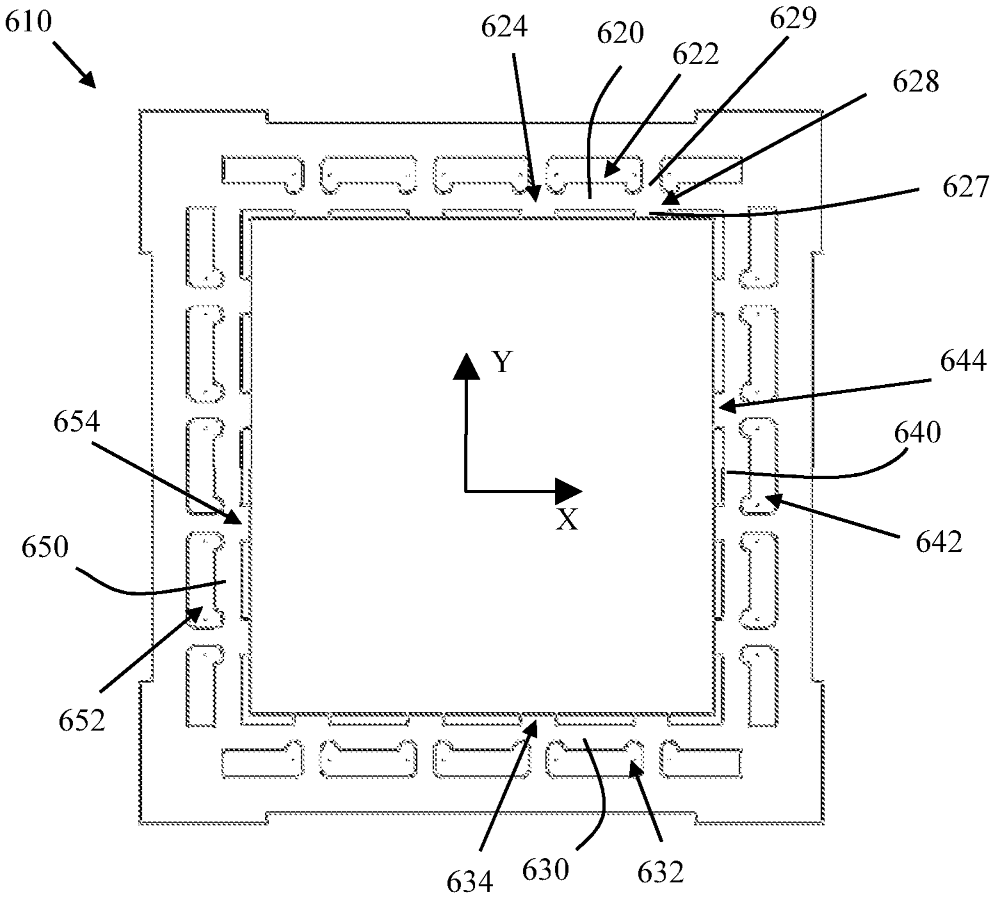
FIG. 6 shows a top view of still another lead frame in examples of the present disclosure.

Process 400 may be also applied to the lead frame 610 of FIG. 6. The lead frame 610 comprises one or more die paddles, a first dam bar 620, a second dam bar 630, a third dam bar 640, a fourth dam bar 650, a first plurality of slots 622, a second plurality of slots 632, a third plurality of slots 642, a fourth plurality of slots 652, a first plurality of leads 624, a second plurality of leads 634, a third plurality of leads 644, and a fourth plurality of leads 654.

Still referring to FIG. 6, the first plurality of leads 624 extend away from the one or more die paddles along a first direction (positive Y-direction). Each of the first plurality of leads 624 is connected to the first dam bar 620. A second plurality of leads 634 extend away from the one or more die paddles along a second direction (negative Y-direction). Each of the second plurality of leads 634 is connected to the second dam bar 630. The third plurality of leads 644 extend away from the one or more die paddles along a third direction (positive X-direction). Each of the third plurality of leads 644 is connected to the third dam bar 640. A fourth plurality of leads 654 extend away from the one or more die paddles along a fourth direction (negative X-direction). Each of the fourth plurality of leads 654 is connected to the fourth dam bar 650.

Each of the first plurality of leads 624 comprises a base member and a protrusion member. For example, the lead 628 comprises a base member 627 and a protrusion member 629. Each of the second plurality of leads 634 comprises a base member and a protrusion member. Each of the third plurality of leads 644 comprises a base member and a protrusion member. Each of the fourth plurality of leads 654 comprises a base member and a protrusion member.

Figure 7:
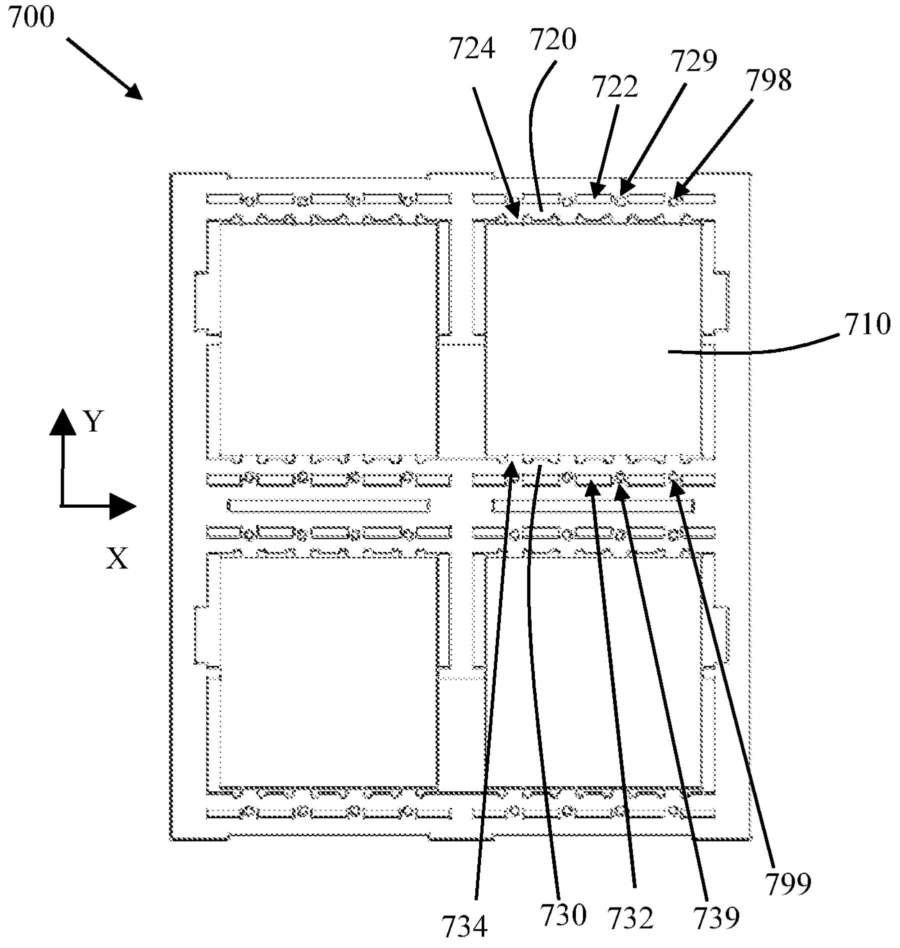
FIG. 7 shows a top view of a lead frame array in examples of the present disclosure.

Process 400 may be also applied to a lead frame array 700 of FIG. 7. The lead frame array 700 comprises one or more lead frames including a lead frame 710. The lead frame 710 comprises one or more die paddles, a first dam bar 720, a second dam bar 730, a first plurality of slots 722, a second plurality of slots 732, a first plurality of holes 729, a second plurality of holes 739, a first plurality of leads 724 (extending along positive Y direction), and a second plurality of leads 734 (extending along negative Y direction). Each of the first plurality of holes 729 is between a respective pair of slots of the first plurality of slots 722. Each of the second plurality of holes 739 is between a respective pair of slots of the second plurality of slots 732. In one example, each of the first plurality of holes 729 and the second plurality of holes 739 are of a circular shape. In another example, each of the first plurality of holes 729 and the second plurality of holes 739 are of a "+" shape. After going through all the steps of process 400, an end surface at a tip 798 of a lead of the first plurality of leads 724 will be plated because of the first plurality of holes 729. An end surface at a tip 799 of a lead of the second plurality of leads 734 will be plated because of the second plurality of holes 739.

Those of ordinary skill in the art may recognize that modifications of the embodiments disclosed herein are possible. For example, a number of leads may vary. Other modifications may occur to those of ordinary skill in this art, and all such modifications are deemed to fall within the purview of the present invention, as defined by the claims.

The invention claimed is:

1. A method for fabricating a semiconductor package, the method comprising the steps of:

providing a lead frame array comprising
- one or more lead frames, each lead frame of the one or more lead frames comprising one or more die paddles;
  - a first dam bar comprising:
    - a first plurality of dam bar connecting sections;
  - a second dam bar comprising:
    - a second plurality of dam bar connecting sections;
  - a first plurality of slots between the first dam bar and a first side of said each lead frame;
  - a second plurality of slots between the second dam bar and a second side of said each lead frame, the second side of said each lead frame being opposite the first side of said each lead frame;

a first plurality of leads extending away from the one or more die paddles along a first direction, each of the first plurality of leads being connected to the first dam bar; and a second plurality of leads extending away from the one or more die paddles along a second direction opposite the first direction, each of the second plurality of leads being connected to the second dam bar;

mounting a chip on the one or more die paddles;

forming a molding encapsulation enclosing the chip;

applying a cutting process or a punching process removing the first plurality of dam bar connecting sections and the second plurality of dam bar connecting sections;

plating tin on portions of the lead frame array not covered by the molding encapsulation; and applying a singulation process;

wherein a first plurality of rectangular holes are between the first plurality of dam bar connecting sections and the one or more die paddles, and wherein a lateral dimension of each of the first plurality of rectangular holes between the first plurality of dam bar connecting sections and the one or more die paddles is smaller than a lateral dimension of a corresponding dam bar connecting section of the first plurality of dam bar connecting sections.

2. The method of claim 1, before the step of forming the molding encapsulation, applying a wire bonding process or a clip bonding process.

3. The method of claim 1, wherein each of the first plurality of dam bar connecting sections and the second plurality of dam bar connecting sections comprises a first end section;

a center section; and a second end section opposite the first end section;

wherein a cross-sectional area of the first end section is smaller than a cross-sectional area of the center section; and wherein a cross-sectional area of the second end section is smaller than the cross-sectional area of the center section.

4. The method of claim 1, wherein each of the first plurality of leads comprises:

a base member; and a protrusion member directly connected to the base member of said first plurality of leads;

wherein a width of the protrusion member of said each of the first plurality of leads is less than fifty percent of a width of the base member of said each of the first plurality of leads;

wherein each of the second plurality of leads comprises:

a base member; and a protrusion member directly connected to the base member of said second plurality of leads; and wherein a width of the protrusion member of said each of the second plurality of leads is less than fifty percent of a width of the base member of said each of the second plurality of leads.

5. The method of claim 1, wherein each of the first plurality of dam bar connecting sections comprises:

a first arc portion; and a second arc portion; and wherein each of the first plurality of dam bar connecting sections comprises:

a first arc portion; and a second arc portion.

6. The method of claim 1, wherein each lead frame of the one or more lead frames further comprises a first plurality of rectangular holes between the first plurality of dam bar connecting sections and the one or more die paddles;

wherein a lateral dimension of each of the first plurality of rectangular holes is smaller than a lateral dimension of a corresponding dam bar connecting section of the first plurality of dam bar connecting sections.

7. The method of claim 1, wherein each lead frame of the one or more lead frames further comprises a third dam bar comprising:

a third plurality of dam bar connecting sections;

a fourth dam bar comprising:

a fourth plurality of dam bar connecting sections;

a third plurality of slots between the third dam bar and a third side of said each lead frame;

a fourth plurality of slots between the fourth dam bar and a fourth side of said each lead frame, the fourth side of said each lead frame being opposite the third side of said each lead frame;

a third plurality of leads extending away from the one or more die paddles along a third direction perpendicular to the first direction, each of the third plurality of leads being connected to the third dam bar; and a fourth plurality of leads extending away from the one or more die paddles along a fourth direction opposite the third direction, each of the fourth plurality of leads being connected to the fourth dam bar; and wherein said applying the cutting process or the punching process further removes the third plurality of dam bar connecting sections and the fourth plurality of dam bar connecting sections.

8. The method of claim 7, wherein each of the third plurality of leads comprises:

a base member; and a protrusion member directly connected to the base member of said third plurality of leads;

wherein a width of the protrusion member of said each of the third plurality of leads is less than fifty percent of a width of the base member of said each of the third plurality of leads;

wherein each of the fourth plurality of leads comprises:

a base member; and a protrusion member directly connected to the base member of said fourth plurality of leads; and wherein a width of the protrusion member of said each of the fourth plurality of leads is less than fifty percent of a width of the base member of said each of the fourth plurality of leads.

9. A method for fabricating a semiconductor package, the method comprising the steps of:

providing a lead frame array comprising one or more lead frames, each lead frame of the one or more lead frames comprising one or more die paddles;

a first dam bar comprising:

a first plurality of dam bar connecting sections;

a second dam bar comprising:

a second plurality of dam bar connecting sections;

a first plurality of slots between the first dam bar and a first side of said each lead frame;

a second plurality of slots between the second dam bar and a second side of said each lead frame, the second side of said each lead frame being opposite the first side of said each lead frame;

a first plurality of leads extending away from the one or more die paddles along a first direction, each of the first plurality of leads being connected to the first dam bar; and a second plurality of leads extending away from the one or more die paddles along a second direction opposite the first direction, each of the second plurality of leads being connected to the second dam bar;

mounting a chip on the one or more die paddles;

forming a molding encapsulation enclosing the chip;

applying a cutting process or a punching process removing the first plurality of dam bar connecting sections and the second plurality of dam bar connecting sections;

plating tin on portions of the lead frame array not covered by the molding encapsulation; and applying a singulation process, wherein each lead frame of the one or more lead frames further comprises a first plurality of holes, each of the first plurality of holes being between a respective pair of slots of the first plurality of slots; and a second plurality of holes, each of the second plurality of holes being between a respective pair of slots of the second plurality of slots.

10. The method of claim 9, before the step of forming the molding encapsulation, applying a wire bonding process or a clip bonding process.

11. The method of claim 9, wherein each of the first plurality of dam bar connecting sections and the second plurality of dam bar connecting sections comprises a first end section;

a center section; and a second end section opposite the first end section;

wherein a cross-sectional area of the first end section is smaller than a cross-sectional area of the center section; and wherein a cross-sectional area of the second end section is smaller than the cross-sectional area of the center section.

12. The method of claim 9, wherein each of the first plurality of leads comprises:

a base member; and a protrusion member directly connected to the base member of said first plurality of leads;

wherein a width of the protrusion member of said each of the first plurality of leads is less than fifty percent of a width of the base member of said each of the first plurality of leads;

wherein each of the second plurality of leads comprises:

a base member; and a protrusion member directly connected to the base member of said second plurality of leads; and wherein a width of the protrusion member of said each of the second plurality of leads is less than fifty percent of a width of the base member of said each of the second plurality of leads.

13. The method of claim 9, wherein each of the first plurality of dam bar connecting sections comprises:

a first arc portion; and a second arc portion; and wherein each of the first plurality of dam bar connecting sections comprises:

a first arc portion; and a second arc portion.

14. The method of claim 9, wherein each lead frame of the one or more lead frames further comprises a first plurality of rectangular holes between the first plurality of dam bar connecting sections and the one or more die paddles;

wherein a lateral dimension of each of the first plurality of rectangular holes is smaller than a lateral dimension of a corresponding dam bar connecting section of the first plurality of dam bar connecting sections.

15. The method of claim 9, wherein each lead frame of the one or more lead frames further comprises a third dam bar comprising:

a third plurality of dam bar connecting sections;

a fourth dam bar comprising:

a fourth plurality of dam bar connecting sections;

a third plurality of slots between the third dam bar and a third side of said each lead frame;

a fourth plurality of slots between the fourth dam bar and a fourth side of said each lead frame, the fourth side of said each lead frame being opposite the third side of said each lead frame;

a third plurality of leads extending away from the one or more die paddles along a third direction perpendicular to the first direction, each of the third plurality of leads being connected to the third dam bar; and a fourth plurality of leads extending away from the one or more die paddles along a fourth direction opposite the third direction, each of the fourth plurality of leads being connected to the fourth dam bar; and wherein said applying the cutting process or the punching process further removes the third plurality of dam bar connecting sections and the fourth plurality of dam bar connecting sections.

16. The method of claim 15, wherein each of the third plurality of leads comprises:

a base member; and a protrusion member directly connected to the base member of said third plurality of leads;

wherein a width of the protrusion member of said each of the third plurality of leads is less than fifty percent of a width of the base member of said each of the third plurality of leads;

wherein each of the fourth plurality of leads comprises:

a base member; and a protrusion member directly connected to the base member of said fourth plurality of leads; and wherein a width of the protrusion member of said each of the fourth plurality of leads is less than fifty percent of a width of the base member of said each of the fourth plurality of leads.

* * * * *